United States Patent
Hsieh et al.

(10) Patent No.: US 9,443,882 B2
(45) Date of Patent: Sep. 13, 2016

(54) FAN-OUT STRUCTURE AND DISPLAY PANEL USING THE SAME

(71) Applicant: Innolux Corporation, Miao-Li County (TW)

(72) Inventors: Yao-Lien Hsieh, Miao-Li County (TW); Jen-Chih Lu, Miao-Li County (TW); Neng-Hsien Wang, Miao-Li County (TW); Ching-Lung Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/634,961

(22) Filed: Mar. 2, 2015

(65) Prior Publication Data

US 2015/0294988 A1    Oct. 15, 2015

(30) Foreign Application Priority Data

Apr. 9, 2014 (TW) .............................. 103112946 A

(51) Int. Cl.
| | |
|---|---|
| *H01L 27/12* | (2006.01) |
| *H01L 23/52* | (2006.01) |
| *G02F 1/1345* | (2006.01) |
| *H01L 27/32* | (2006.01) |
| *G02F 1/1362* | (2006.01) |

(Continued)

(52) U.S. Cl.
CPC ......... *H01L 27/124* (2013.01); *G02F 1/13452* (2013.01); *G02F 2001/133388* (2013.01); *G02F 2001/136295* (2013.01); *G09G 1/00* (2013.01); *H01L 23/52* (2013.01); *H01L 27/3237* (2013.01); *H01L 27/3241* (2013.01); *H01L 27/3244* (2013.01)

(58) Field of Classification Search
CPC . H01L 27/124; H01L 23/52; H01L 27/3237; H01L 27/3241; H01L 27/3244; G02F 1/136286; G02F 2001/133388; G02F 2001/136295; G09G 1/00; G09G 2230/00
USPC .......................... 257/40, 59, 72; 345/100, 55
See application file for complete search history.

(56) References Cited

U.S. PATENT DOCUMENTS

| | | | |
|---|---|---|---|
| 5,870,163 A | 2/1999 | Watanabe et al. | |
| 6,104,465 A * | 8/2000 | Na .......................... | G02F 1/1345 349/152 |
| 6,842,200 B1 * | 1/2005 | Su .......................... | G02F 1/1345 349/139 |

(Continued)

FOREIGN PATENT DOCUMENTS

TW    I397736 B1    6/2013

OTHER PUBLICATIONS

TIPO Office Action dated Oct. 26, 2015 in corresponding Taiwan application (No. 103112946).

*Primary Examiner* — Galina Yushina
(74) *Attorney, Agent, or Firm* — McClure, Qualey & Rodack, LLP

(57) ABSTRACT

A display panel comprising a fan-out structure located in a peripheral region is provided. The peripheral region has two border regions and a central region. The fan-out structure of the peripheral region comprises a plurality of first fan-out wires and a plurality of second fan-out wires alternatively arranged with the first fan-out wires. In the border regions, resistance of the first fan-out wire is lower than that of the adjacent second fan-out wire. In the central region, resistance of the first fan-out wire is higher than that of the adjacent second fan-out wire.

10 Claims, 2 Drawing Sheets

(51) Int. Cl.
  *G09G 1/00* (2006.01)
  *G02F 1/1333* (2006.01)

(56) References Cited

U.S. PATENT DOCUMENTS

| | | |
|---|---|---|
| 7,012,664 B2 | 3/2006 | Moon et al. |
| 7,113,246 B2 | 9/2006 | Yamaguchi et al. |
| 7,267,555 B2 | 9/2007 | Huang et al. |
| 7,705,952 B2 | 4/2010 | Lee et al. |
| 7,893,436 B2 | 2/2011 | Kim et al. |
| 8,064,029 B2 | 11/2011 | Park |
| 2010/0283955 A1* | 11/2010 | Kim .............. G02F 1/1345 349/149 |
| 2012/0293762 A1* | 11/2012 | Shin .............. G09G 3/3677 349/139 |

\* cited by examiner

FAN-OUT STRUCTURE AND DISPLAY PANEL USING THE SAME

This application claims the benefit of Taiwan application Serial No. 103112946, filed Apr. 9, 2014, the subject matter of which is incorporated therein by reference.

BACKGROUND OF THE INVENTION

1. Field of the Invention

The present disclosure relates in general to a fan-out structure and the display panel, and more particularly to a fan-out structure having two types of fan-out wire electrical resistances alternatively arranged and a display panel using the same.

2. Description of the Related Art

Liquid crystal display (LCD) has been widely used in various electronic products such as mobile phone, notebook and Tablet PC. Furthermore, along with the booming growth in the market of large-sized planar display, LCD, having the features of lightweight and slimness, plays a crucial role and has gradually replaced cathode ray tube (CRT) and become a mainstream product in the display market.

How to provide a display with excellent display quality and overcome related difficulties and problems in the manufacturing process has become a prominent task for the industries.

SUMMARY OF THE INVENTION

The present disclosure is directed to a fan-out structure and a display panel. In the fan-out structure of the embodiments, electrical resistance of the first fan-out wires is lower than electrical resistance of the second fan-out wires in the border regions, but electrical resistance of the first fan-out wires is higher than electrical resistance of the second fan-out wires in the central region, such that the first fan-out wires can have a larger wire width and a larger pitch between wires. Through such design, process window can be enlarged, degree of difficulty in manufacturing processes can be lowered, such that the wire width and pattern of the manufactured first fan-out wires are more uniform, and electrical resistance uniformity of the first fan-out wires can be increased.

According to one embodiment of the invention, a display panel comprising a substrate and a fan-out structure disposed on a peripheral region of the substrate is provided. The peripheral region has at least two border regions and a central region, wherein the central region is disposed between the two border regions. The fan-out structure of the peripheral region comprises a plurality of first fan-out wires and a plurality of second fan-out wires alternatively arranged with the first fan-out wires. In the border regions, electrical resistance of the first fan-out wires is lower than electrical resistance of the adjacent second fan-out wires. In the central region, electrical resistance of the first fan-out wires is higher than electrical resistance of the adjacent second fan-out wires.

The above and other aspects of the invention will become better understood with regard to the following detailed description of the preferred but non-limiting embodiments. The following description is made with reference to the accompanying drawings.

DETAILED DESCRIPTION OF THE INVENTION

In a fan-out structure disclosed in the embodiments of the present disclosure, electrical resistance of the first fan-out wires is lower than electrical resistance of the second fan-out wires in the border regions, but electrical resistance of the first fan-out wires is higher than electrical resistance of the second fan-out wires in the central region, such that the first fan-out wires can have a larger wire width and a larger pitch between wires. Through such design, process window can be increased, degree of difficulty in manufacturing processes can be reduced, the first fan-out wires can have more uniform wire width and pattern, and electrical resistance uniformity of the first fan-out wires can be increased.

Detailed descriptions of the embodiments of the disclosure are disclosed below with accompanying drawings. In the accompanying diagrams, the same numeric designations indicate the same or similar components. It should be noted that accompanying drawings are simplified so as to provide clear descriptions of the embodiments of the disclosure, and the following detailed description are exemplary and explanatory only and are not restrictive of the disclosed embodiments as claimed. Anyone who is skilled in the technology field of the disclosure can make necessary modifications or variations to the structures according to the needs in actual implementations.

Figure 1:
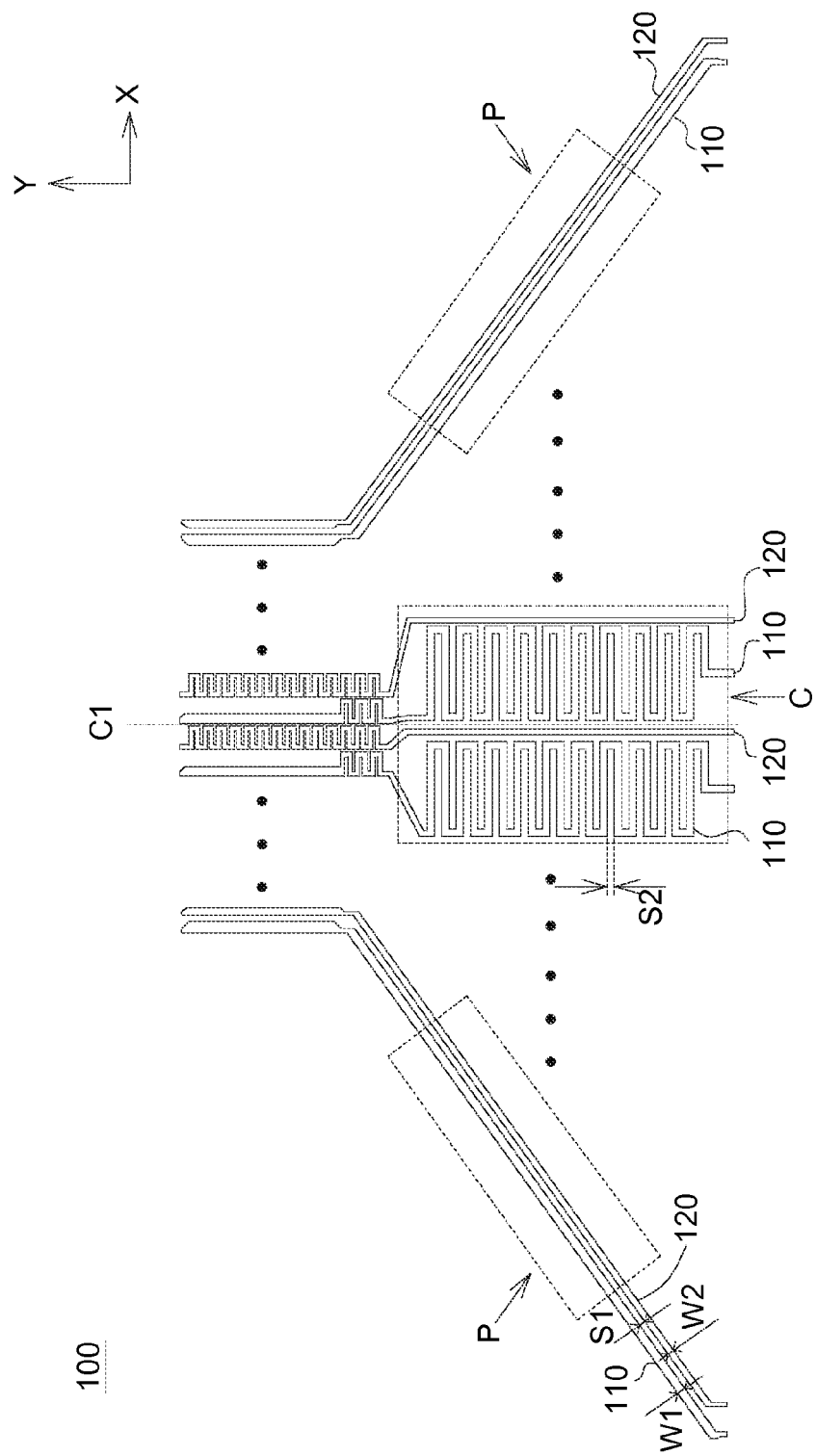
FIG. 1 is a top view of a peripheral region according to an embodiment of the present disclosure.
Figure 2:
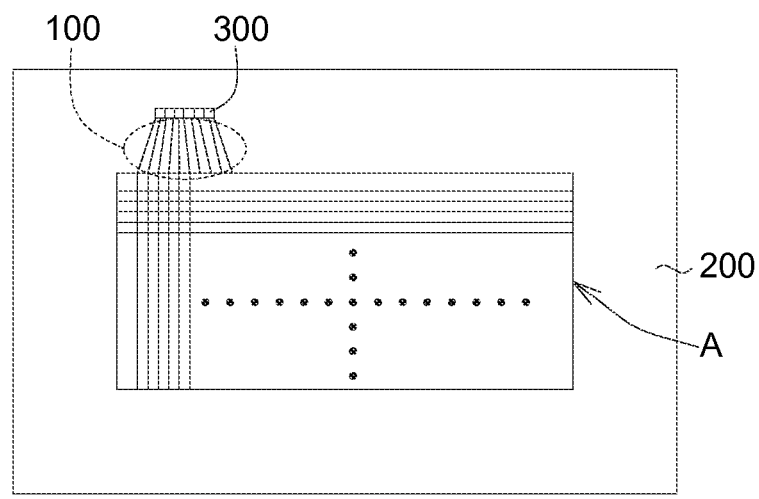
FIG. 2 is a top view of a peripheral region located on a substrate according to an embodiment of the present disclosure.

FIG. 1 and FIG. 2 are top views of a peripheral region 100 according to an embodiment of the present disclosure. As indicated in FIG. 1 and FIG. 2, the peripheral region 100 is adjacent to a display region A, and the peripheral region 100 has at least two border regions P and a central region C disposed between the two border regions P. The fan-out structure disposed on the peripheral region 100 is formed by a plurality of wires. The wires transfer driving signals of the display. The fan-out structure comprises a plurality of first fan-out wires 110 and a plurality of second fan-out wires 120 alternatively arranged with the first fan-out wires 110. For example, when the fan-out structure has N fan-out wires, and N is usually an even number. Then, the first fan-out wires 110 are the odd-numbered wires (1, 3 . . . N−3, N−1), and the second fan-out wires 120 are the even-numbered wires (2, 4 . . . N−2, N). In the border regions P, the electrical resistance of the first fan-out wires 110 is lower than that of the adjacent second fan-out wires 120. For example, the electrical resistance of the first (or the $(N-1)^{th}$) one of the first fan-out wires 110 is smaller than the electrical resistance of the second (or the $N^{th}$) one of the adjacent second fan-out wires 120. In other words, in the border regions P, the ratio of the electrical resistance of the first fan-out wires 110 to the electrical resistance of the second fan-out wires 120 is smaller than 1. In the central region C, the electrical resistance of the first fan-out wires 110 is higher than the electrical resistance of the adjacent second fan-out wires 120. For example, the electrical resistance of the $((N/2)-1)^{th}$ one of the first fan-out wires 110 is larger than that of the $(N/2)^{th}$ one of the second fan-out wires 120. In other words, in the central region C, the ratio of the electrical resistance of the first fan-out wires 110 to the electrical resistance of the second fan-out wires 120 is loss larger than 1. The ratio of the electrical resistance of the first fan-out wires 110 to the electrical resistance of the second fan-out wire 120 has a turning point between each of the border regions P and the central region C. The turning point is at the junction between the border regions P and the central region C.

In the embodiment, both sides of the peripheral region 100 have a border region P, and the outmost one of the first fan-out wires 110 or the outmost one of the second fan-out wires 120 of the fan-out structure is located in the border region P. For example, as indicated in FIG. 1, the outmost first fan-out wire 110 is located in the left-hand side of the border region P, and the outmost second fan-out wire 120 is located in the right-hand side of the border region P.

In an embodiment, the first fan-out wires 110 and the second fan-out wires 120 are arranged alternatively. That is, in the fan-out structure, all odd-numbered wires are first fan-out wires 110, and all even-numbered wires are second fan-out wires 120. As indicated in FIG. 1, in the fan-out structure, one first fan-out wire 110 and one second fan-out wire 120 are paired to form a unit, and multiple pairs of the first fan-out wires 110 and the second fan-out wires 120 are symmetric with respect to a virtual centerline C1. Therefore, two outer sides of the peripheral region 100 have two border regions P.

In the embodiment, at least one of the first fan-out wires 110 has a meander-shaped pattern, and at least one of the second fan-out wires 120 has a meander-shaped pattern. In the embodiment, in the central region C, the area of the meander-shaped pattern of the first fan-out wires 110 is larger than the area of the meander-shaped pattern of the second fan-out wires 120. As indicated in FIG. 1, the main structure of the first fan-out wires 110 in the central region C has a meander-shaped pattern, the main structure of the first fan-out wires 110 in the border regions P has a strip pattern, and the main structure of the second fan-out wires 120 has a strip pattern in both the central region C and the border region P. In the embodiment, the magnitude of tortuosity in the pattern of the first fan-out wires 110 progressively decreases towards the border regions P from the central region C.

In the embodiment, in the central region C, the length of the first fan-out wires 110 is larger than the length of the adjacent second fan-out wires 120. This is because that the second fan-out wires 120 in the central region C basically have a strip pattern, and the first fan-out wires 110 in the central region C have a large magnitude of tortuosity, making the length of the first fan-out wires 110 larger than that of the second fan-out wires 120. Moreover, the length of the second fan-out wires 120 progressively decreases towards the central region C from the border regions P at the two sides of the central region C.

Furthermore, as indicated in FIG. 1, in the central region C, the area of the first fan-out wires 110 is larger than the area of the second fan-out wires 120 (wires plus spacing gaps) because the first fan-out wires 110 have a zigzag pattern and a larger length. Since the first fan-out wires 110 have a larger area, the first fan-out wires 110 can be designed to have a larger wire width and a larger pitch between wires. Through such design, process window can be enlarged, tolerance of the manufacturing process error can be increased, and degree of difficulty in the manufacturing process can be lowered, such that the wire width and pattern of the manufactured first fan-out wires 110 are more uniform, and electrical resistance uniformity of the first fan-out wires 110 can thus be increased.

As indicated in FIG. 1, the first fan-out wires 110 have a first wire width W1, the second fan-out wires 120 have a second wire width W2, and the first wire width W1 is larger than the second wire width W2. In the embodiment, the first wire width W1 is larger than or equivalent to 6 micrometers (μm), and the space S1 between any two adjacent first fan-out wire 110 and second fan-out wire 120 is larger than or equivalent to 5 μm. In an embodiment, the first wire width W1 is such as 6.1 μm, and the space S1 between two adjacent first fan-out wire 110 and second fan-out wire 120 is such as 5 μm. Besides, in the present embodiment, the meander-shaped segments of the first fan-out wires 110 in the central region C are separated by a space S2, and the space S2 is such as larger than or equivalent to 5 μm.

Moreover, in the embodiment, the first wire width W1 of the first fan-out wires 110 is larger than the second wire width W2 of the second fan-out wires 120, such that the electrical resistance of the first fan-out wires 110 can be effectively reduced. Particularly, in the border regions P, the electrical resistance of the first fan-out wires 110 can be lower than that of the second fan-out wires 120.

In an embodiment, the RC product (RC loading) of the first fan-out wires 110 is different from that of the second fan-out wires 120. For instance, since the first fan-out wires 110 and the second fan-out wires 120 are electrically connected to different types of elements and generate different levels of RC products (RC loadings), the first fan-out wires 110 and the second fan-out wires 120 need to have different designs of output impedance. In an embodiment, the first fan-out wires 110 are such as electrically connected to more elements (such as thin-film transistors and capacitors) than the second fan-out wires 120 are. Thus, the output impedance of the first fan-out wires 110 needs to be lower than that of the second fan-out wires 120 to maintain output stability and increase uniformity.

FIG. 2 is a top view of the peripheral region 100 located on a substrate 200 of a display panel 10 according to an embodiment of the present disclosure. Refer to FIGS. 1-2. In an embodiment, the peripheral region 100 is located between at least one driving element 300 and the display region A on the substrate 200. The fan-out region 100 comprises a fan-out structure for transmitting signals of the driving element 300 to the display region A. The driving element 300 can be such as a gate driver IC, a data driver IC, a gate driver on panel or a data driver on panel. The display region A comprises a pixel matrix and wires of a connection region thereof. The display panel can be such as a thin-film transistor panel. Driver circuit(s), such as thin-film transistor(s), capacitor(s), electrode(s), and trace(s), or self-luminous display structure(s) can be disposed on the display panel. The display device can be formed from a display panel, a cover, a display medium, a polarizer, a driver circuit module and a backlight module. The cover, opposite to the display panel, can have a color filter array, a black matrix or a touch detection circuit. The display device can additionally have a touch module or a 2D/3D optical adjustment module to provide different functions.

In an embodiment, the display panel 10 is exemplified by a multi-domain vertical alignment display, the first fan-out wires 110 are such as electrically connected to a plurality of main gates, and the second fan-out wires 120 are such as electrically connected to a plurality of charge sharing gates, such that the display panel 10 can achieve the effects of wide viewing angle and low color shift. In the embodiment, the electrical resistance of the first fan-out wires 110 has high uniformity of such as between ±1%. Relatively, the electrical resistance of the second fan-out wires 120 does not need to have high uniformity, which is such as between 200-300%.

In the present embodiment, the electrical resistance uniformity required by the second fan-out wires 120 is much lower than that required by the first fan-out wires 110. In terms of the space distribution of the fan-out wires 110 and 120, the first fan-out wires 110 occupy a larger area than the second fan-out wires 120 do, therefore process window of the first fan-out wires 110 can be enlarged, wire width and pattern of the manufactured first fan-out wires 110 are more uniform, and electrical resistance uniformity of the first fan-out wires can thus be increased. As such, degree of difficulty in manufacturing processes can be reduced without jeopardizing the functions of the elements.

In another embodiment, the fan-out structure can be used in a 3D display. The first fan-out wires 110 and the second fan-out wires 120 are electrically connected to the operating elements and wires corresponding to the left eye and the right eye, respectively.

Figure 3:
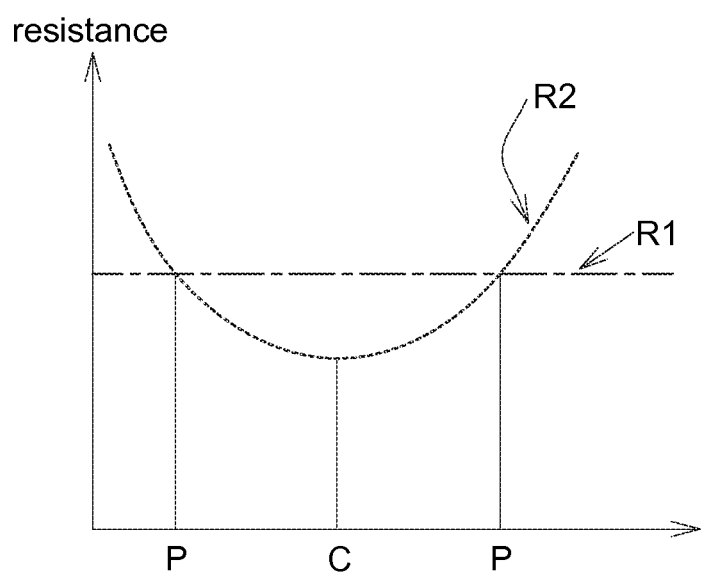
FIG. 3 is a diagram showing the relationship between measured electrical resistance of the fan-out wires and their corresponding regions according to an embodiment of the present disclosure.

FIG. 3 is a diagram showing the relationship between measured electrical resistance of the fan-out wires and their corresponding regions according to an embodiment of the present disclosure. As indicated in FIG. 3, the horizontal axis represents the fan-out region 100 along an X direction of FIG. 1, and the curve R1 and the curve R2 respectively represent the measured electrical resistances of the first fan-out wires 110 and the second fan-out wires 120 along the X direction.

As indicated in FIG. 3, the measured electrical resistances of the first fan-out wire 110 in the central region C and the border regions P located two sides of the central region C has very high uniformity. That is, the measured electrical resistances of the first fan-out wire 110 basically remain the same regardless of what the corresponding region is. As for the second fan-out wires 120, as indicated in FIG. 3, since the length of the second fan-out wire 120 progressively decreases towards the central region C from the border regions P of the two sides, the measured electrical resistance of the second fan-out wires 120 is higher in the border regions P and progressively decrease towards the central region C from the border regions P. That is, the measured electrical resistance of the second fan-out wire 120 in the border regions P is larger than that in the central region C. Thus, the relationship between the measured electrical resistance of the first fan-out wire 110 and the measured electrical resistance of the second fan-out wire 120 in the central region C is different from that in the border regions P.

Based on the relationship between the electrical resistances of the fan-out wires 110 and 120 in different regions, the first fan-out wires 110 can be designed to have a larger wire width and a larger pitch between wires. Through such design, process window can be enlarged, degree of difficulty in manufacturing processes can be lowered, such that the wire width and pattern of the manufactured first fan-out wires 110 are more uniform, and electrical resistance uniformity of the first fan-out wires 110 can thus be increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel comprising a substrate and a fan-out structure, wherein the fan-out structure is disposed on a peripheral region of the substrate, the peripheral region under the fan-out structure comprises two border regions and a central region disposed between the two border regions, and the fan-out structure comprises:
   a plurality of first fan-out wires; and
   a plurality of second fan-out wires alternatively arranged with the first fan-out wires,
      wherein in the border regions, electrical resistance of a first fan-out wire is higher than electrical resistance of an adjacent second fan-out wire,
      wherein in the central region, electrical resistance of a first fan-out wire is higher than electrical resistance of an adjacent second fan-out wire.

2. The display panel according to claim 1, wherein in the central region, at least one of the first fan-out wires has a meander-shaped pattern, at least one of the adjacent second fan-out wires has a meander-shaped pattern, and an area of the first fan-out wire with its meander-shaped pattern is larger than an area of the adjacent second fan-out wire with its meander-shaped pattern.

3. The display panel according to claim 1, wherein in the central region, length of at least one of the first fan-out wires is larger than length of at least one of the adjacent second fan-out wires.

4. The display panel according to claim 1, wherein the first fan-out wires have a first wire width, the adjacent second fan-out wires have a second wire width, and the first wire width is larger than the second wire width.

5. The display panel according to claim 1, wherein a RC product of the first fan-out wires is different from a RC product of the adjacent second fan-out wires.

6. The display panel according to claim 1, wherein the fan-out structure is located between at least one driving element and a display region on the substrate.

7. The display panel according to claim 1, wherein the first fan-out wires are electrically connected to a plurality of main gates, and the second fan-out wires are electrically connected to a plurality of charge sharing gates.

8. The display panel according to claim 1, wherein electrical resistance variance between the first fan-out wires is between ±1%.

9. The display panel according to claim 1, wherein electrical resistance variance between the second fan-out wires is larger than electrical resistance between the first fan-out wires.

10. The display panel according to claim 1, wherein electrical resistance of some of the second fan-out wires in the border regions is larger than electrical resistance of some of the second fan-out wires in the central region.

* * * * *